Figure 1:
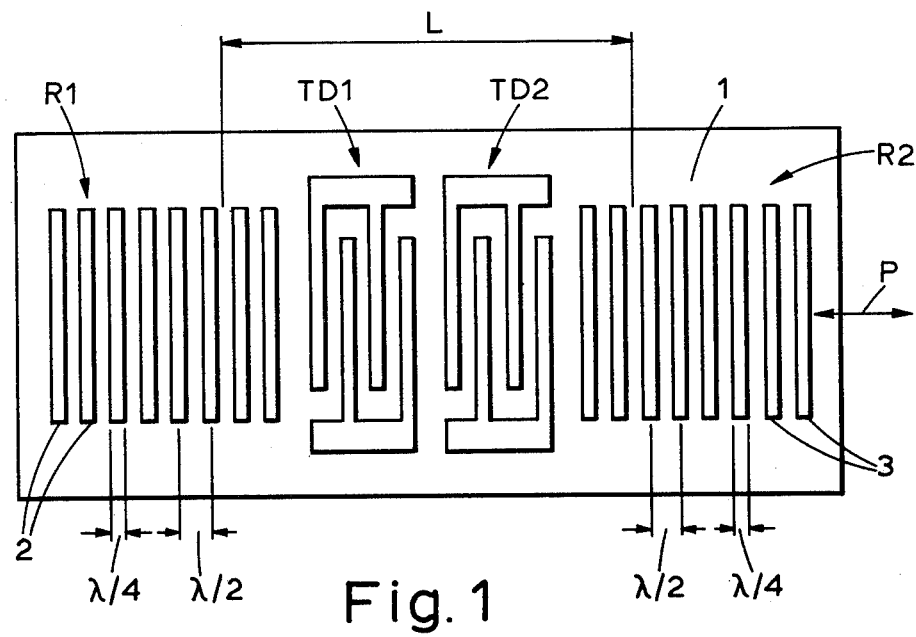

United States Patent [19]

Stevens et al.

[11] 4,281,301

[45] Jul. 28, 1981

[54] ACOUSTIC WAVE DEVICES

[75] Inventors: Richard Stevens, Copthorne; Richard F. Mitchell, Merstham; Philip D. White, Chessington, all of England

[73] Assignee: U.S. Philips Corporation, New York, N.Y.

[21] Appl. No.: 74,694

[22] Filed: Sep. 12, 1979

[30] Foreign Application Priority Data

Sep. 22, 1978 [GB] United Kingdom ............... 37798/78

[51] Int. Cl.³ ........................ H03H 9/64; H03H 9/25
[52] U.S. Cl. ................................ 333/195; 333/151; 333/194
[58] Field of Search ............................ 333/150-155, 333/193-196; 331/107 A; 330/5.5; 310/313, 313 R, 313 A, 313 B, 313 C, 313 D

[56] References Cited

U.S. PATENT DOCUMENTS 4,155,056 5/1979 Cross et al. ........................ 333/195
4,155,057 5/1979 Sandy et al. ........................ 333/195
4,162,466 7/1979 Hunsinger et al. .................. 333/194

Primary Examiner—Marvin L. Nussbaum
Attorney, Agent, or Firm—Bernard Franzblau

[57] ABSTRACT

In an acoustic wave device having a pair of spaced apart reflectors forming a resonant cavity, each reflector consists of an array of parallel reflective elements. At least one of the reflectors is weighted not by simple withdrawal of reflecting elements from a nominal uniform array but instead by substituting reflective elements of the uniform array with elements providing both net-zero reflection at required positions and also at least partial compensation for the velocity perturbation which would be produced by such simple withdrawal. Such weighting may be used to suppress the side lobes of the reflector response and hence improve the stopband performance of the acoustic wave device and, for example, a coupled resonator filter in which that device is incorporated.

16 Claims, 23 Drawing Figures

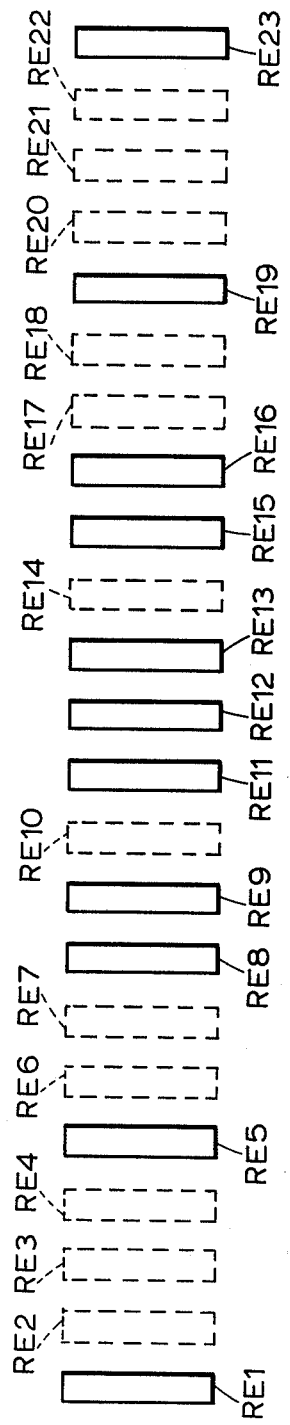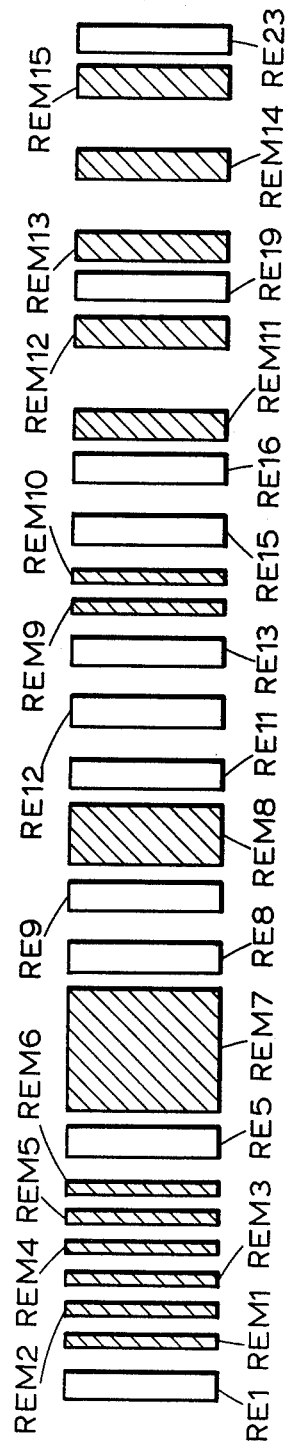

ACOUSTIC WAVE DEVICES

This invention relates to acoustic wave resonator devices including a substrate able to propagate acoustic waves, a pair of spaced apart reflectors forming a resonant cavity capable of supporting acoustic standing wave energy in the substrate, each said reflector consisting of an array of parallel reflective elements disposed one behind another at a surface of said substrate, and a transducer including an array of electrodes disposed at said substrate surface for coupling with acoustic standing wave energy in the cavity. Devices of this type may be used singly or in combination as frequency filters, particularly at VHF frequencies.

From an article by K. M. Lakin and T. R. Joseph entitled "Surface Wave Resonators" in the 1975 IEEE Ultrasonics Symposium Proceedings at pages 269 to 278 and also from an article by P. S. Cross entitled "Surface Acoustic Wave Resonator—Filters Using Tapered Gratings" in the 1977 IEEE Ultrasonics Symposium Proceedings at pages 894 to 899 devices of the above type are known in which at least one of the reflectors is modified with respect to a nominal uniform array consisting of equal reflectivity equally spaced reflective elements, the reflectivity-frequency characteristic of the uniform array having a main lobe and side lobes centred on a predetermined frequency and the reflectivityfrequency characteristic of said at least one modified reflector having a passband substantially similar to said main lobe and a stopband suppressed compared with said side lobes.

In the above-mentioned article by Lakin and Joseph the reflective elements are shown as continuous strips and each reflector of an acoustic surface wave resonator (shown in FIG. 10) is modified with respect to a uniform array by continuously reducing the length of the reflecting elements starting with a full length element nearest the cavity centre. A resulting substantial suppression of the side lobe response of the reflectors, which is stated to be a spurious response of the resonator device, is shown to result from this length-weighting technique. It is stated on page 276 of this article in respect of this length-weighting of the reflectors that: "This will result in a reflected wave whose amplitude will vary across the aperture of the IDT (that is the interdigital transducer which is in the cavity). However, this is acceptable since the IDT will integrate this variation across its aperture".

In the above-mentioned article by Cross with respect to the reflective elements it is stated on page 895 that: "In order to experimentally implement tapered gratings, arrays of aluminium dots have been deposited— —and the dots are nominally 6 $\mu$m diameter circles arranged in rows with a nominal period of 12 $\mu$m—. The number of dots per row is proportional to the desired local coupling coefficient, and the local period is adjusted to compensate the spatial variation of the Bragg frequency that is induced by the taper". Examples are shown of the effect of various taper functions on the reflectivity-frequency characteristic of a single reflector, and of the effect of tapering one or both reflectors of single acoustic surface wave resonator filters and multiple coupled acoustic surface wave filters. In all cases, the suppression of the reflector side lobe responses improves the stopband response of the filters.

A disadvantage of the length-weighting arrangement for the reflectors described in the article by Lakin and Joseph is that the variation in amplitude of the reflected wave across the aperture of the transducer in the cavity unacceptably complicates the design of the device if it is desired to length-weight the transducer. A disadvantage of the dot-weighting arrangement for the reflectors described in the article by Cross is that splitting the reflective elements into regularly spaced discrete dots introduces diffraction and refraction effects which need to be eliminated by a further complication in the design of the device involving randomisation of the positions of the dots.

An object of the invention is to provide an alternative arrangement for modifying the otherwise uniform reflectors of an acoustic wave resonator so as to achieve suppression of the reflector side lobe responses while avoiding the above-mentioned disadvantages of the arrangements disclosed in the articles by Lakin and Joseph and by Cross.

According to the invention there is provided an acoustic wave resonator device as described in the opening two paragraphs of this specification, characterised in that the reflective elements of said nominal uniform array are each a discontinuity formed as a strip at said substrate surface, said strips each having the same depth and length and being centred on the same line of acoustic wave propagation at said substrate surface with said strips each being a quarter wavelength wide and being located at a centre to centre spacing along said line of propagation of half a wavelength of said acoustic waves at said predetermined frequency. The modification of said at least one reflector with respect to the uniform array includes a plurality of sets of at least one consecutive strip which substitute for an equal number of similarly positioned sets of at least one consecutive strip of the uniform array. The depth and length of the substituting strips is the same as that of the strips of the uniform array and the number, width and location along said line of propagation of the at least one strip of each substituting set is such that each substituting set provides net-zero reflection of said acoustic waves at said predetermined frequency. In a reflector array modified according to this characteristic feature of the invention the substituting sets may be formed such that together they provide at least partial compensation for the velocity perturbation of said acoustic waves which would occur if the same net-zero reflection were provided by simple withdrawal of strips for the uniform array.

Withdrawal weighting, that is to say passband shaping and stopband suppression by selectively removing fingers from an otherwise periodic array, is known per se in respect of acoustic surface wave interdigital transducers, for example from an article by C. S. Hartmann entitled "Weighting Interdigital Surface Wave Transducers by Selective Withdrawal of Electrodes" in the 1973 IEEE Ultrasonics Symposium Proceedings at pages 423 to 426. The problem of phase errors which occur due to velocity perturbation of the acoustic surface waves resulting from the simple withdrawal weighting proposed by Hartmann is recognised in an article by R. S. Wagers entitled "Phase Error Compensation in Finger Withdrawal Transducers" in the 1974 IEEE Ultrasonics Symposium Proceedings at pages 418 to 421, and a design method is proposed in this article by Wagers which involves finger withdrawal as proposed by Hartmann followed by altering the positions of the remaining fingers of the interdigital transducer to provide phase error compensation.

U.S. Pat. No. 3,883,831 discloses various acoustic surface wave devices in which the response of a delay line provided by two interdigital transducers is shaped by one or more inclined arrays of reflective elements which direct the surface waves between the transducers. Both dispersive and non-dispersive devices are disclosed, and weighting the reflectivity-frequency response of the reflective arrays by varying the length of the reflective elements and by varying the depth of the reflective elements is disclosed. However, neither a resonant cavity formed between a pair of reflective arrays nor withdrawal weighting of reflective arrays is disclosed in this U.S. patent. U.K. Pat. No. 1,484,859 claims a dispersive surface wave delay line having at least one electroacoustic transducer and a reflective array of fingers on a piezo-electric surface in which the spacing between the fingers is graded so that acoustic waves of different wavelengths are reflected by different portions of the array. In order to provide amplitude spectrum weighting some of the fingers are offset from their nominal positions in a similarly graded unweighted array to disturb the optimum conditions for constructive interference of the reflected waves at predetermined frequencies so as to reduce the reflected amplitude at these frequencies by an amount determined by the offset. In the only specific embodiment disclosed, for each frequency at which the reflected amplitude is to be reduced the fingers reflective at that frequency are arranged in pairs and the spacing between adjacent pairs exceeds the spacing between adjacent fingers reflective at said frequency in said similarly graded unweighted array by the same amount as said spacing between adjacent fingers exceeds the spacing between fingers in a pair. Thus, although in the general teaching of this U.K. patent there is the idea of reduced reflection at selected positions by offsetting some reflective elements, the only example given is such that it cannot be used to provide net-zero reflection at any position of the unweighted array. Thus withdrawal weighting of reflective arrays is not disclosed in this U.K. patent. In an article by Richard C. Williamson entitled "Properties and Applications of Reflective-Array Devices" in the Proceedings of the IEEE, Vol. 64, No. 5, May 1976 at pages 702 to 710 an extensive survey is given of the use of reflective arrays in surface wave devices. It is stated that "A number of different grating geometries, substrates, and types of reflectors have been employed in resonators, bandpass filters, filter banks, oscillators and dispersive delay lines". The legend to FIG. 1 of this article is "FIG. 1. Geometries employed in reflective-array devices. (a) Normal-incidence resonator. (b) One-bounce at oblique incidence. (c) Two-bounce u path. (d) Two-bounce z path", and the legend to FIG. 3 of this article is "FIG. 3. Techniques for weighting the response of a reflective array. (a) Simple length weighting. (b) Length weighting with filled-in dummy reflectors. (c) Squared-off grating. (d) Density weighting in a reflective dot array". Weighting techniques for reflective arrays are discussed in detail in the text and in particular the advantages and disadvantages of the techniques (a) to (d) shown in FIG. 3. However, although the normal-incidence resonator, that is to say the device of the type described in the first paragraph of this specification, is disclosed in this article by Williamson, the technique of withdrawal weighting, which at the time of this article was well known for interdigital transducers as a result of the above-mentioned article by Hartmann, is not mentioned by Williamson in his discussion of various possible weighting techniques for reflective arrays.

The basic idea of this invention is the application to the reflectors of devices as described in the opening two paragraphs of this specification of withdrawal weighting which is realized not by simple withdrawal of reflecting elements from the nominal uniform array but instead by substituting reflective elements of the uniform array with elements providing both net-zero reflection at required positions and also at least partial compensation for the velocity perturbation which would be produced by such simple withdrawal.

An advantage of this basic idea of withdrawal by substitution of strips is that different reflector arrays in which the reflectivity of the elements is changed by changing the depth of the strips may be easily designed without the need to change the substitution arrangement from one array to another. By comparison, if withdrawal weighting by actual withdrawal of reflective elements together with velocity perturbation compensation by repositioning the remaining reflective elements were to be instead adopted, that is to say making analogous use of the design method proposed for acoustic surface wave interdigital transducers by Wagers in the above-mentioned article in the 1974 IEE Ultrasonics Symposium Proceedings, then different reflector arrays in which the reflectivity of the elements is changed by changing the depth of the strips could not be easily designed since it would be necessary to change the repositioning arrangement from one array to another.

As to whether an inventive step is involved in the application of withdrawal weighting to the reflectors of devices as described in the opening two paragraphs of this specification, it could be argued on the one hand in favour of such an inventive step that having regard to the large amount of prior art as acknowledged above concerning weighting of reflector arrays in acoustic surface wave devices, including resonators, it is surprising that it has not been already adopted or suggested, whereas it could be argued on the other hand against such an inventive step that having regard to that prior art it is an obvious technique to try. Be that as it may, we would argue that the basic idea of this invention as outlined in the penultimate paragraph, that is to say the provision of withdrawal weighting in the reflector arrays of acoustic wave resonators by substituting elements of the arrays which simultaneously provide zero weighting at the required positions together with velocity perturbation compensation, is a combination of features which is in no way suggested by the combined teaching of the relevant prior art and so is not obvious having regard to that prior art, and therefore involves an inventive step.

A first optional feature of a resonator device according to the invention is that at least one substituting set may consist of the same number of at least two strips as the number of strips of the similarly positioned set of the uniform array, the width of each strip of that substituting set being a quarter wavelength of said acoustic waves at said predetermined frequency, and the strips of that substituting set having a centre to centre spacing along said line of propagation which differs from that of the strips of the similarly positioned set of the uniform array. In one example of this first optional feature, that substituting set consists of two strips having a centre to centre spacing along said line of propagation of three quarters of a wavelength of said acoustic waves at said predetermined frequency. In a second example of this first optional feature, that substituting set consists of three strips having a centre to centre spacing along said line of propagation of two thirds of a wavelength of said acoustic waves at said predetermined frequency. An advantage of this first optional feature is that, since both the number and width of the strips of the substituting set is the same as that of the strips of the similarly positioned set of the uniform array, the strips of that substituting set provide complete compensation for the velocity perturbation of acoustic wave which would occur if the same net-zero reflection were provided by simple withdrawal of strips from the uniform array. A disadvantage of this first optional feature is that the substituting set cannot provide net-zero reflection in place of a similarly positioned set of the uniform array consisting of only a single strip.

A second optional feature of a resonator device according to the invention is that at least one substituting set may consist of at least one pair of strips, each pair of strips substituting for a corresponding one of the at least one strip of the similarly positioned set of the uniform array, and the strips of each pair having a width of an eighth of a wavelength and a centre to centre spacing of a quarter wavelength of said acoustic waves at said predetermined frequency. An advantage of this second optional feature is that the substituting set can provide net-zero reflection in place of a similarly positioned set of the uniform array consisting of only a single strip.

In connection with the above-mentioned second optional feature of this invention, it may be noted that the use of split fingers for reflection cancellation is known per se in respect of acoustic surface wave interdigital transducers, for example from an article by T. W. Bristol et al in the 1972 IEEE Ultrasonics Symposium Proceedings at pages 343 to 345. In this case, splitting the fingers per se suppressed reflections at a predetermined frequency as a spurious secondary response of the transducer and does not weight the transducer for the purpose of shaping its primary required response. In the case of the second optional feature of this invention, however, splitting selected strips weights the reflective array for the purpose of shaping its primary required response, that is to say suppressing the stopband response of the array.

A third optional feature of a resonator device according to the invention is that at least one substituting set may consist of a single strip, the width of the single strip being n half wavelengths, where n is an integral number including one, of said acoustic waves at said predetermined frequency. An advantage of this third optional feature is that the substituting set can provide, when the width of the constituent single strip is one half wavelength, net-zero reflection in place of a similarly positioned set of the uniform array consisting of only a single strip.

In a resonator device according to the invention, the reflective elements of the reflectors may each be a groove in the surface of said substrate. Another possibility is that the reflective elements of the reflectors may each be a layer of conductive material on the surface of said substrate. In this latter case the reflective elements of the reflectors and the electrodes of the transducer may be formed of the same conductive material. Furthermore, in that same latter case the reflective elements of each reflector may be connected by at least one bus bar of conductive material on the surface of said substrate.

According to a further optional feature of a resonator device according to the invention each of the pair of reflectors may be modified with respect to a respective nominal uniform array consisting of equal reflectivity equally spaced reflective elements, the reflectivity-frequency characteristic of each respective uniform array having a main lobe and side lobes centred on a predetermined respective frequency and the reflectivity-frequency characteristic of each modified reflector having a passband substantially similar to said respective main lobe and a stopband suppressed compared with said respective side lobes. An advantage of this feature is, where the nominal uniform array is the same for both reflectors, enhancement of the stopband suppression of the combined reflectivity-frequency response of the pair of reflectors. In this case each pair of reflectors may be similarly modified with respect to the same nominal uniform array.

The Q value of the cavity of a resonator device as described in the first paragraph of this specification is approximately inversely proportional to $1-|R|$ where R is the reflectivity of the reflectors for values of $|R|$ close to unity and is proportional to the effective length L of the cavity. Thus, where a high Q cavity is required, this is achieved in the first instance by making R as close to unity as possible. A high value of R is associated with a large number of reflective elements in each reflector. However, as the number of elements is increased, eventually the size of the reflectors becomes inconveniently large. Thus for a further improvement in the Q value the effective length L of the cavity, which is dependent on the distance by which the reflectors are spaced apart, must be large. The resonant modes which the cavity is capable of strongly supporting are those modes which occur at frequencies within the combined reflectivity-frequency passband of the reflectors. A large number of reflective elements in each reflector results in a narrow reflectivity-frequency passband, and a large distance between the two reflectors results in a small frequency separation between adjacent mode frequencies. Where the distance between the reflectors is large the reflectivity-frequency passband of the reflectors can be made small to counteract the correspondingly small frequency separation between adjacent mode frequencies and thereby include only a small number of mode frequencies. However, when the reflectivity-frequency passband is reduced so as to include only three resonant modes further reduction of the reflectivity-frequency passband or reduction in the effective length L does not result in exclusion of the two outer modes, that is to say that those two outer modes become closer to the central mode and remain at the edges of the reflectivity-frequency passband.

According to a further optional feature of a resonator device according to the invention, the device may have single mode operation by arranging the configuration of the reflectors relative to the distance by which they are spaced apart so that the combined reflectivity-frequency passband of the pair of reflectors includes only three adjacent distinct resonant mode frequencies and by further arranging the transducer in the cavity so as to have a zero net coupling with standing wave energy in the cavity at the two outer mode frequencies and a non-zero net coupling with standing wave energy at the middle mode frequency. This arrangement of the transducer is provides that the array of electrodes is interdigitally connected in the transducer to a pair of terminals and is symmetrically arranged with respect to a central point of the cavity so as to form a plurality of pairs of electrodes with the electrodes of each pair being equally spaced in opposite directions from that central point. The central point of the cavity may coincide with a node and an anti-node respectively of the standing wave at an even mode frequency which is the middle one of said three frequencies and at odd mode frequencies which are the other two of said three frequencies. In this case the two electrodes of each pair are electrically connected to different ones of said pair of terminals. The central point of the cavity may alternatively coincide with a node and an anti-node respectively of the standing wave at an odd mode frequency which is the middle one of said three frequencies and at even mode frequencies which are the other two of said three frequencies. In this case the two electrodes of each pair are electrically connected to the same one of said pair of terminals. Thus the transducer can be considered as made up of two equal halves, one in each half of the cavity. In the case of a single transducer located in the cavity, each half of the transducer can occupy anything from a small portion of its half of the cavity, which may be near the centre or near the reflectors, up to the whole of its half of the cavity. If two transducers are required to be in the cavity both transducers can have equally efficient suppression of the two outer modes with the two halves of one transducer being adjacent in a region between the two halves of the other transducers.

The optional feature of the invention described in the previous paragraph is described and claimed in U.S. patent application No. 947,141 filed Sept. 29, 1978.

An electrical filter may be provided including two acoustic wave resonator devices, both according to the invention, in which said transducer in one of the devices forms input transducing means arranged to launch acoustic wave energy into the cavity of that device which forms acoustic standing wave energy therein. This electric filter also includes for coupling the cavities of the two devices whereby acoustic standing wave energy is formed in the cavity of the other device, and wherein said transducer in the other device forms output transducing means arranged to receive acoustic wave energy from the cavity of the other device.

A known property of coupled resonator electrical filters is that for resonators having a given Q value, strong coupling between the resonators is associated with a low insertion loss of the filter and a large bandwidth passband at the (or each) coupled mode frequency whereas weak coupling between the resonators is associated with a high insertion loss of the filter and a small bandwidth passband at the (or each) coupled mode frequency. For a filter having a required small bandwidth associated with the appropriate weak degree of coupling between the resonators, the insertion loss will be lower if the Q value of the resonators is higher. Thus low loss very narrow bandwidth coupled resonator filters require very high Q resonators. In this case, if these very high Q resonators are of the acoustic wave resonant cavity type with reflective element array reflectors and the coupled resonator filter is required to have a very low stopband level outside a low loss single resonant mode narrow passband, then the two adjacent outer modes respectively above and below the frequency of the required single mode which will be strongly supported by the cavities, since they cannot be brought outside the reflectivity-frequency passband of the reflectors, as has been discussed above, become a problem. The frequency of the single required mode will be arranged to be at the centre of the reflectivity-frequency passband and thus the amplitude of these two outer modes will be lower than this central mode as a result of the sloping sides of the reflectivity-frequency passband. By cascading the cavities, the general level of the stopband response of the filter outside these three coupled resonant modes of the cavities can be lowered to a very low level which is below the amplitude of the two outer modes. In this case, the arrangement of the transducers (as described above) so that they do not couple to these two outer modes will enable an unspoilt stopband response of the filter to be achieved at the cascaded very low level outside the required very narrow low loss single mode passband in the frequency ranges where a response due to the two outer modes would otherwise be present above that very low level. The very low level unspoilt stopband response of the filter just mentioned will, in the case of the present invention, be low not only due to the cascading of the cavities but also due to the suppression of the cavity modes at frequencies outside the reflectivity-frequency passbands of the reflectors of cavities resulting from the stopband suppression of the reflectivity-frequency characteristics of the cavity forming reflectors.

In resonator devices or electrical filters according to the invention the acoustic waves which the substrates are able to propagate may be surface acoustic waves propagating in the surface of the substrates on which the transducers and reflectors are disposed or they may be bulk acoustic waves propagating parallel and close to that surface of the substrate. The possible use of this type of bulk acoustic wave is mentioned in connection with delay line feedback oscillators in U.K. Pat. No. 1,451,326 and a range of rotated Y-cuts of quartz with propagation perpendicular to the X-axis suitable for this purpose is described in Electronics Letters, 3rd March 1977, Vol. 13, No. 5 at pages 128 to 130.

Figure 2:
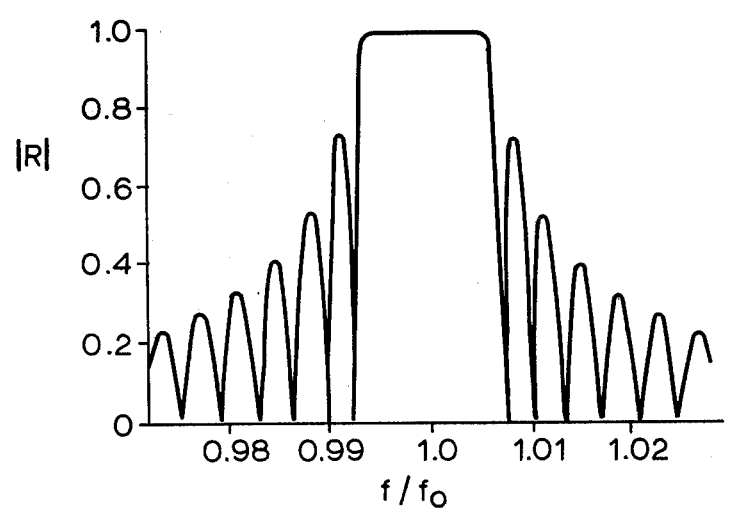
Figure 3:
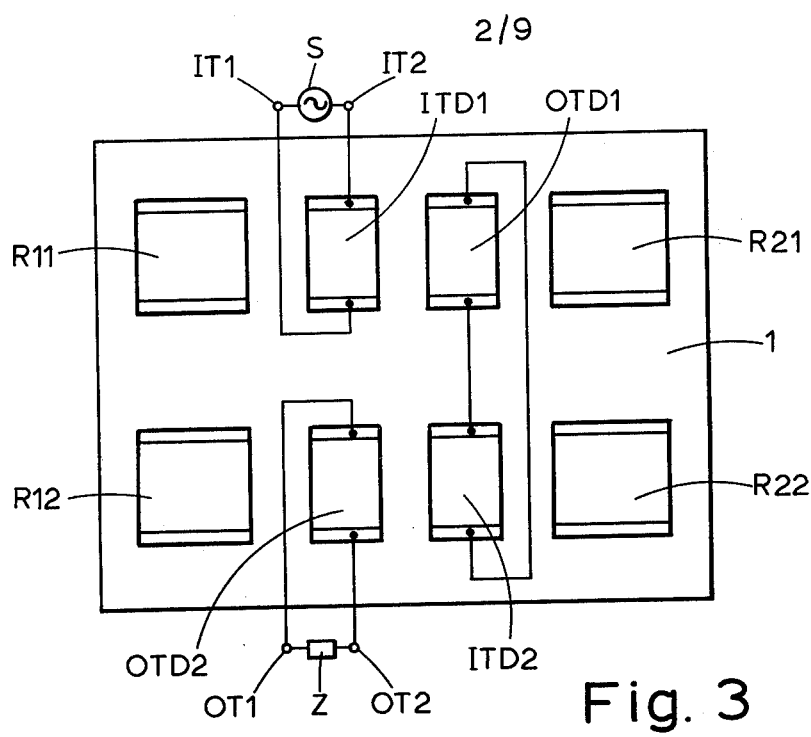
Figure 4:
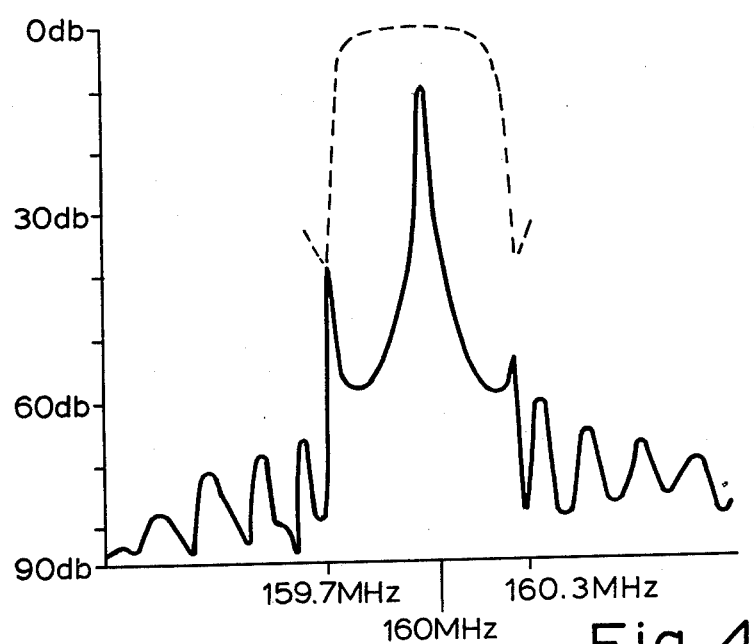
Figure 5E:
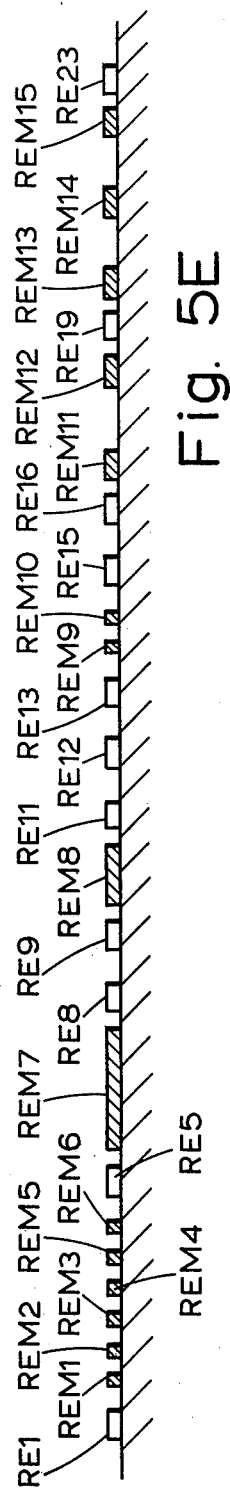
Figure 7:
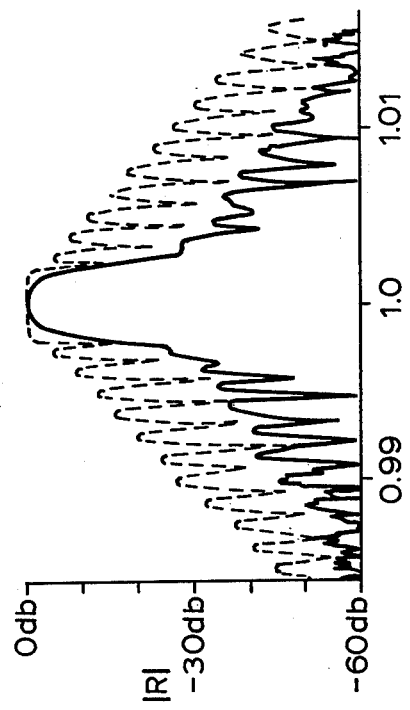
Figure 6A:
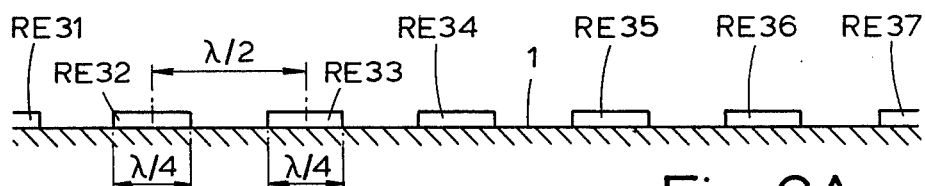
Figure 8:
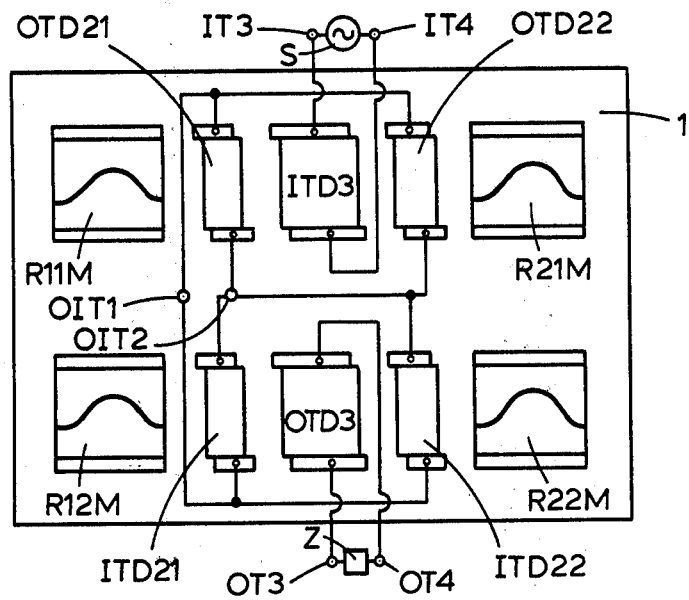
Figure 10:
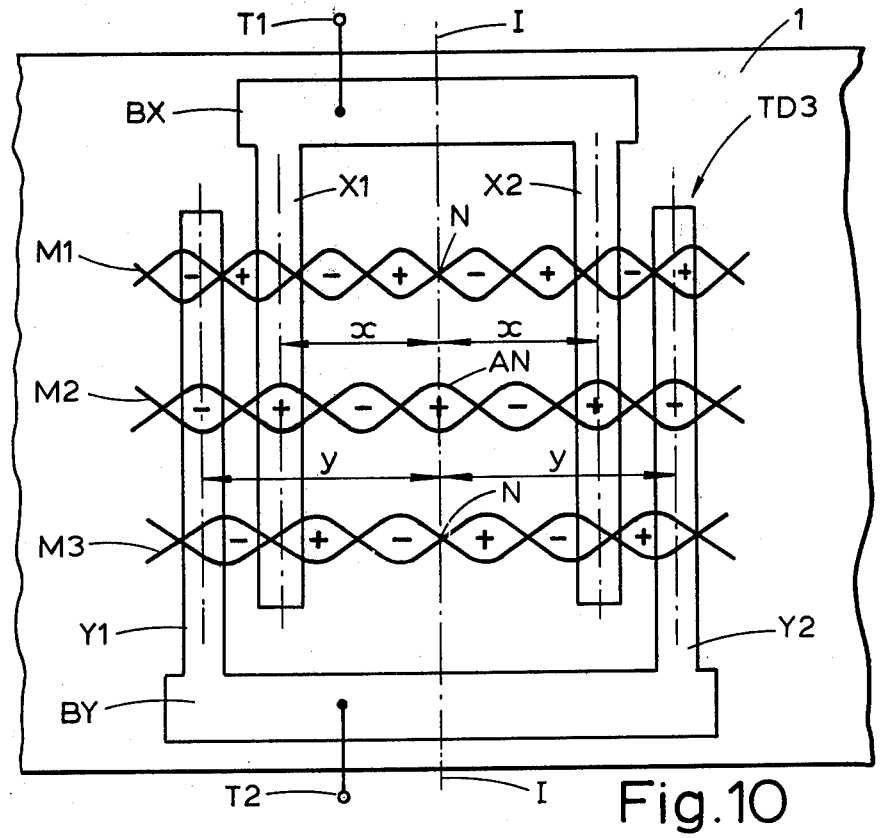
Figure 9:
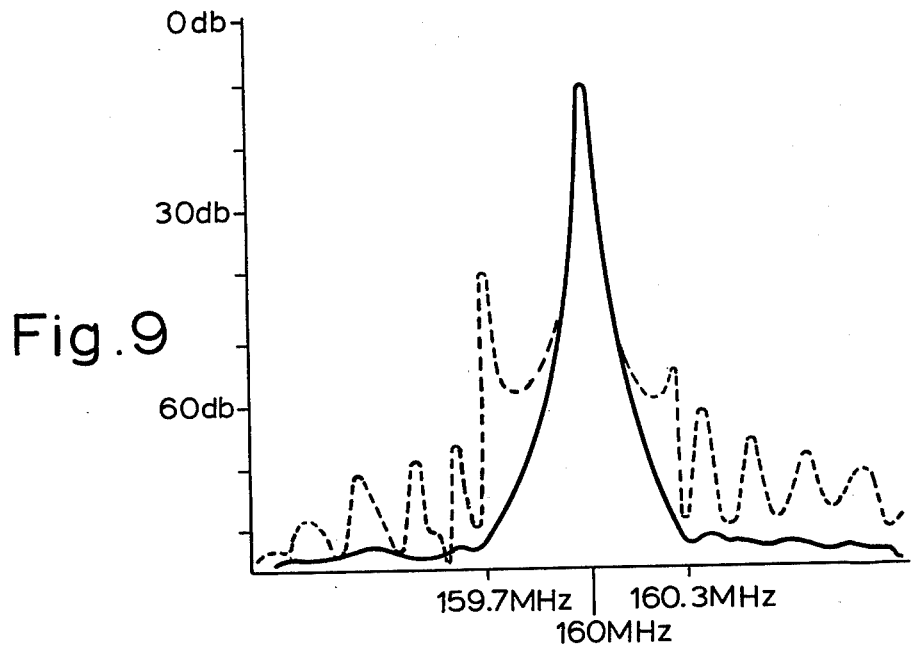
Figure 12:
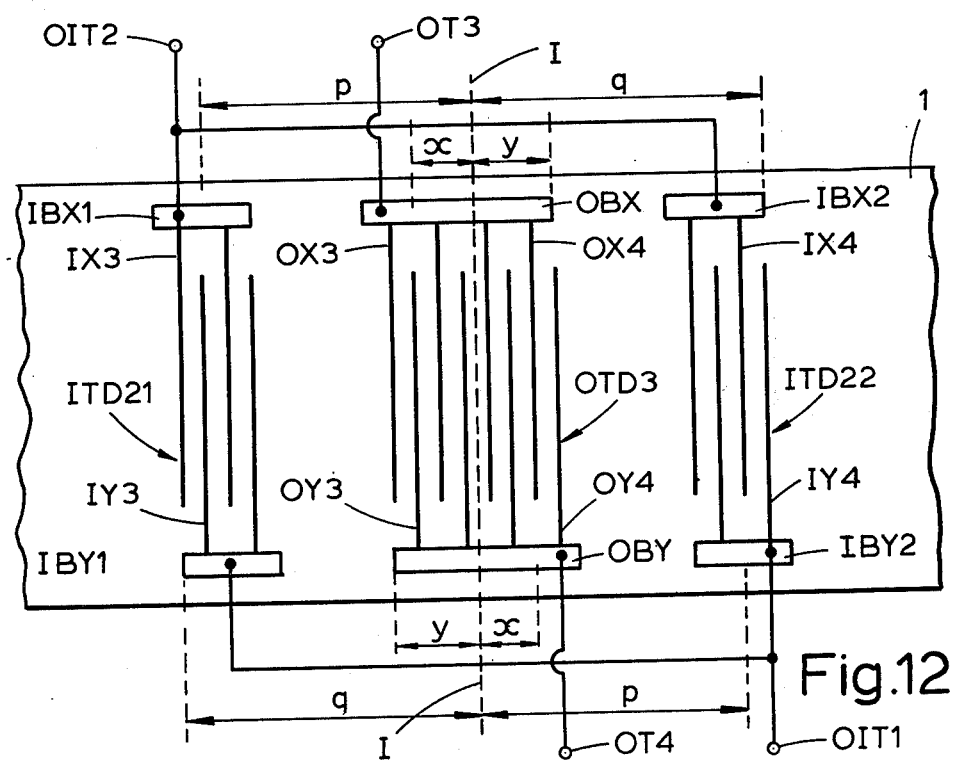
Figure 11:
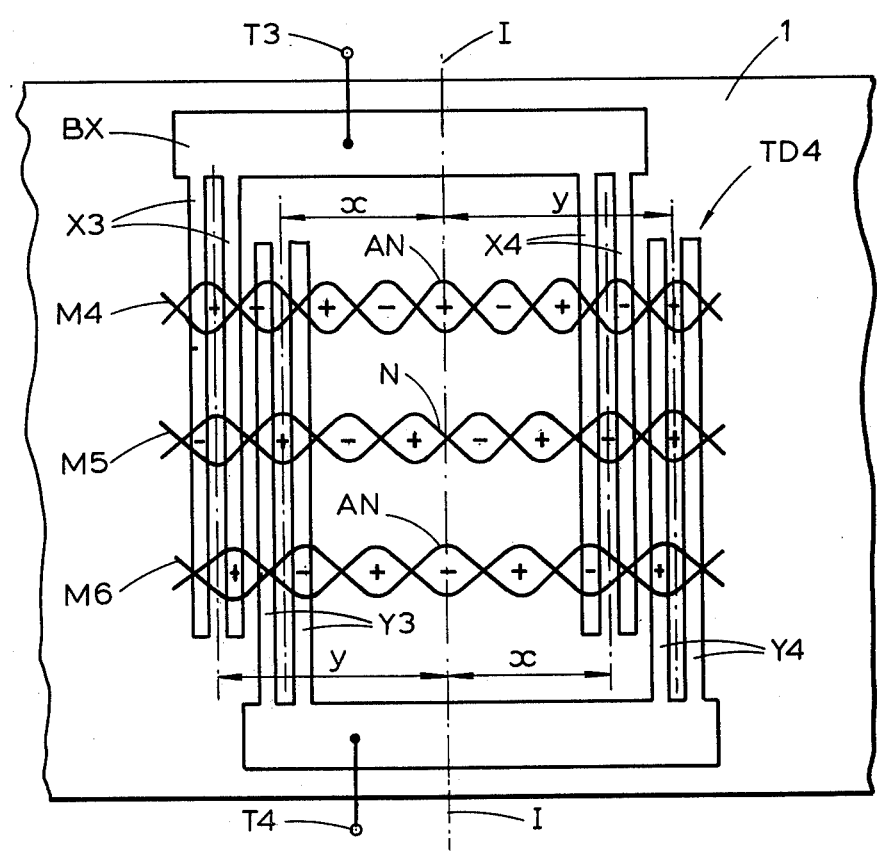

The invention will now be described in more detail with reference to the accompanying drawings, in which:

FIG. 1 is a schematic plan view of an acoustic wave resonator device having two interdigital transducers in a resonant cavity formed between two reflectors, the reflectors each being shown as a uniform array without the modification which is a characteristic feature of the invention, FIG. 2 shows the computed characteristic of reflectivity with respect to frequency of a typical example of each of the uniform array reflectors shown in FIG. 1, FIG. 3 is a schematic plan view of a transducer coupled acoustic wave resonator filter, the reflectors of the two cavities of this filter again being uniform arrays without the modification which is a characteristic feature of the invention, FIG. 4 shows the amplitude-frequency response of a filter in accordance with the arrangement shown in FIG. 3, FIGS. 5A, 5B and 5C show respectively a plan view of a simple withdrawal weighted reflective array, the weighting of the array as 1's and 0's, and the weighting function of the array as a smoothed curve, FIGS. 5D and 5E show, in plan and sectional view respectively, a reflective array in which withdrawal weighting is realised according to a characteristic feature of the invention, FIG. 6A shows in sectional view an arrangement of strips which may be considered as part of either of the uniform array reflectors forming the resonant cavity shown in FIG. 1, FIGS. 6B to 6H each show the group of strips of FIG. 6A modified by substituting strips which can form one or more sets of substituting strips in a weighted reflector array such as that shown in FIGS. 5D and 5E, FIG. 7 shows the characteristic of reflectivity with respect to frequency of a reflector array weighted in accordance with a characteristic feature of the invention, FIG. 8 is a schematic plan view of a transducer coupled acoustic wave resonator filter, in which the reflectors of the two cavities of this filter are weighted arrays according to a characteristic feature of the invention, in which the two cavities have a combined reflective frequency passband which includes only three resonant modes and the transducers within the cavities are arranged to have maximum coupling to standing wave energy at the middle mode frequency and zero coupling to standing wave energy at the two outer mode frequencies, FIG. 9 shows the amplitude-frequency response of a filter in accordance with the arrangement shown in FIG. 8, FIG. 10 is a schematic plan view of part of an acoustic wave resonator device having a resonant cavity and an interdigital transducer in the cavity arranged for zero coupling to even modes supported by that cavity, FIG. 11 is a schematic plan view of a device similar to that shown in FIG. 10 but in which the interdigital transducer is arranged for zero coupling to odd modes supported by the cavity, and FIG. 12 is schematic plan view of part of an acoustic wave resonator device having a resonant cavity and two interdigital transducers in the cavity each arranged for zero coupling to odd modes supported by the cavity, this being on a reduced scale compared with FIGS. 10 and 11.

Referring now to FIG. 1, there is shown in plan view a substrate 1 able to propagate acoustic waves. This substrate may be any well known piezoelectric substrate able to propagate surface acoustic waves in the surface shown, e.g. lithium niobate or quartz; or it may be a piezoelectric substrate able to propagate bulk acoustic waves parallel and close to the surface shown, e.g. a rotated U-cut of quartz with propagation perpendicular to the X-axis as described in Electronics Letters, 3rd March 1977, Vol 13, No. 5 at pages 128 to 130. In the remainder of the description of this invention the substrate 1 will be assumed to be one of these two types and reference to acoustic waves will mean the appropriate surface acoustic waves or the particular type of bulk waves just described.

A pair of spaced apart reflectors R1 and R2 form a resonant cavity capable of supporting acoustic standing wave energy in the substrate 1 at a plurality of distinct resonant mode frequencies, and two transducers, TD1 and TD2, each including an interdigital array of electrodes, are disposed at the surface of the substrate 1 for coupling with acoustic standing wave energy in the cavity.

Each reflector R1 and R2 is a uniform array consisting of equal reflectivity parallel reflective elements 2 and 3, respectively, dipsosed with equal spacing one behind another at the surface of the substrate 1. The reflective elements 2 and 3 of each uniform array, which are nominal uniform arrays without the modification to be described later which is a characteristic feature of the invention, are each a discontinuity formed as a strip at the surface 1. Each of the strips 2 and 3 of each array have the same depth and length and are centred on the same line P of acoustic wave propagation at the surface 1. Also, the strips 2 and 3 are each a quarter wavelength ($\lambda/4$) wide and are located at a centre to centre spacing along the line of propagation P of half a wavelength ($\lambda/2$) of acoustic waves at a predetermined frequency $F_o$. The reflective elements, 2 and 3, of the reflectors may each be a groove in the surface of the substrate 1. Another possibility is that the reflective elements, 2 and 3, may each be consist of a layer of conductive material on the surface of the substrate 1. In this latter case the reflective elements, 2 and 3, and the electrodes of the transducers TD1 and TD2 may be formed of the same conductive material. Furthermore, in that same latter case the reflective elements of each reflector may be connected by at least one bus bar (not shown) of conductive material on the substrate at the surface 1. Each reflective element, 2 and 3, is provided for reflecting a portion of acoustic wave energy incident thereon and the reflectivity-frequency characteristic of each uniform array has a main lobe and side lobes centred on the predetermined frequency $f_o$.

Referring now to FIG. 2, there is shown the computed characteristic of reflectivity $|R|$ (shown on a linear scale) with respect to the normalised frequency $f/f_o$ of a typical example of each of the uniform array reflectors R1 and R2 consisting of 250 strips each having 2% reflectivity. For a typical centre frequency $f_o$ of 100 MHz, the main lobe of such a reflector array provides a reflective passband of approximately 1.5 MHz centred on said frequency of 100 MHz. Referring back to FIG. 1, the effective length L of the resonant cavity is substantially an integral number of half wavelengths at each of the resonant mode frequencies. In the typical example just mentioned the length L is 500$\mu$ at 100 MHz including a spacing of 400$\lambda$ between the nearest elements 2 and 3 of the reflectors R1 and R2. This length L determines a spacing of 100 KHz between adjacent resonant mode frequencies and thus the cavity is capable of supporting 15 resonant modes within the main lobe reflective passband of 1.5 MHz. As can be seen from FIG. 2, the sidelobes of the uniform array reflector reflectivity-frequency response are high and resonant modes of the cavity which lie within these sidelobes can have significant Q values given by $Q=2\pi|R|L/1-|R|^2$. These "low Q" modes are undesirable and provide a spurious response in the performance of the acoustic wave resonator device shown in FIG. 1.

The device shown in FIG. 1 may be used as such and without modification, that is to say a single cavity containing two transducers, as a two-port single resonator filter. If the device shown in FIG. 1 has only a single transducer it constitutes a resonant circuit element. Two or more resonator devices, having two transducers in each cavity as shown in FIG. 1 or having only a single transducer in the cavity, may be cascaded to form a coupled-resonator electrical filter. In the case of a two resonator filter, for example, means for coupling the two cavities to provide the cascading may take the form of a transducer in each of the cavities with the two transducers electrically connected. Alternatively, the coupling between the two cavities may comprise a multistrip coupler extending between the two cavities, or a modification of the two resonators such that they share a common reflector with acoustic leakage through that common reflector providing the coupling. In all of these uses of the acoustic wave resonator device shown in FIG. 1, and particularly in the case of a coupled-resonator electrical filter, it is desirable to suppress the above-mentioned "low Q" modes which lie within the sidelobes of the reflector response, and this is done by suppressing those sidelobes in a particular manner, to be described later, which is characteristic of the invention. A typical example of such a coupled-resonator filter and its amplitude-frequency response, without this suppression of the "low Q" modes, will now be described.

Referring now to FIG. 3, two devices on the same substrate 1, each having two transducers arranged as shown in FIG. 1, are coupled together. The pair of reflectors R11 and R21, and also the pair of reflectors R12, and R22 are arranged in the same manner as the pair of reflectors R1 and R2 shown in FIG. 1. The input transducer ITD1 is connected to a source of electrical energy S via terminals IT1 and IT2, the output transducer OTD1 is connected to the input transducers ITD2, and the output transducer OTD2 is connected to a load Z via terminals OT1 and OT2. Two acoustic wave resonator devices coupled together as shown in FIG. 3 by electrically connecting the output transducer of the first device to the input transducer of the second device form a coupled resonator electrical filter.

FIG. 4 shows a typical frequency response of a transducer coupled surface acoustic wave coupled resonator electrical filter designed to have a low loss narrow passband. The filter whose response is shown in FIG. 4 is generally in accordance with the arrangement shown in FIG. 3, that is to say that there are two resonant cavities, each cavity is formed by two uniform array reflectors, within each cavity there are two transducers, one transducer in one of the cavities is an input transducer, one transducer in the other cavity is an output transducer and the other two transducers are connected to couple the two cavities. The numerical values given in the more detailed description of this filter which now follows are approximate values only for providing a guide to the realization of a filter having the response shown in FIG. 4. The substrate is ST cut quartz capable of supporting surface acoustic waves. The reflectors which form the cavities each consist of 750 metal strips of 0.2% reflectivity on the surface of the substrate having an effective spacing of half a wavelength of surface acoustic waves at a centre frequency of 160 MHz providing a reflective passband of 600 KHz centred on said centre frequency of 160 MHz. The spacing between the two reflectors of each cavity is 150 wavelengths and the effective length of each cavity is approximately 250 wavelengths at said centre frequency providing a separation between the frequencies of adjacent resonant modes of the cavities of 300 KHz. Thus the configuration of the reflectors relative to the distance by which they are spaced apart is such that the combined reflective frequency passband of the reflectors of the resonators includes only three adjacent distinct resonant mode frequencies of which the centre mode frequency is said centre frequency of 160 MHz. In each cavity each transducer occupies a distance of 60 wavelengths of said centre frequency along the length of the cavity. All the transducers are interdigital transducers having split electrodes whose effective centres are spaced by half a wavelength at said centre frequency of 160 MHz and the transducers are arranged to couple with maximum efficiency to the resonant mode at the centre frequency of 160 MHz. The frequency response of this filter, as shown in FIG. 4 (the solid line), is a bandpass response having an insertion loss of 10 db in a 50 ohm system at the peak response frequency of 160 MHz. This insertion loss can be reduced to approximately 6 db by appropriate impedance matching of the input and output transducers to the external circuit, and it can be further reduced to approximately 3 db by connecting an inductance across the coupling transducers. The bandwidth of the response at 3 db below the peak response is 20 KHz. The stopband level of the response in the region adjacent the bandpass region includes responses which are present at levels of 30 db and 45 db below the peak response corresponding to the two resonant modes which the cavities are capable of supporting at 159.7 MHz and 160.3 MHz respectively. These two responses are just inside the combined reflectivity-frequency passband, shown by the dotted outline, of the reflectors of the resonators. By a special arrangement of the transducers in the cavities (not shown in FIG. 3 but to be described and shown later in this specification) the transducers can have zero coupling to alternate modes which the cavities are capable of supporting. These zero coupled alternate modes will be arranged to include the two modes at 159.7 MHz and 160.3 MHz, and thus the response of the filter at these two frequencies which lie just inside the passband of the reflectors will thereby be suppressed to a very low level of approximately 75 db below the peak response. The associated alternate zero coupled "low Q" modes within the sidelobes of the reflector response will further improve the stopband level of the filter response to an overall level of approximately 60 db below the peak response. The stopband level of the filter response may be still further improved by suppressing the sidelobes of the reflector responses, in the particular manner which will now be described below, and thereby suppressing all the "low Q" modes of the cavities which lie within those sidelobes.

Referring now to FIG. 5A, there is shown in plan view an array of parallel strips RE1, RE5, RE8, RE9, RE11, RE12, RE13, RE15, RE16, RE19 and RE23. If strips RE2, RE3, RE4, RE6, RE7, RE10, RE14, RE17, RE18, RE20, RE21 and RE22, shown in dotted outline, were also present then the strips RE1 and RE23 would form a uniform array of equal reflectivity equally spaced reflective elements constituting any one of the reflectors R1, R2, R11, R21, R12 and R22 forming the resonator cavities shown in FIGS. 1 and 3. The absence of the strips shown in dotted outline provides withdrawal weighting of the otherwise uniform array. FIG. 5B shows the withdrawal weighting of the array as 1's and 0's representing unity reflection (that is to say some small percentage reflectivity) and zero reflection at equal intervals along the array, and FIG. 5C shows this weighting function as a smoothed curve.

Referring now to FIGS. 5D and 5E they show, in plan and sectional view respectively, an array in which withdrawal weighting is realised according to the invention not by simple withdrawal of reflecting elements from the nominal uniform array but instead by substituting reflective elements of the uniform array with elements providing both net-zero reflection at required positions and also at least partial compensation for the velocity perturbation which would be produced by such simple withdrawal. In the array shown in FIGS. 5D and 5E, the strips RE1, RE5, RE8, RE9, RE11, RE12, RE13, RE15, RE16, RE19 and RE23 are as in the uniform array, and strips REM1 to REM15 (shown shaded) form a plurality of sets of at least one consecutive strip which substitute for an equal number of similarly positioned sets of at least one consecutive strip of the uniform array; that is to say that the set of strips REM1 to REM6 substitutes for the set of strips RE2 to RE4 of the uniform array, the set consisting of one strip REM7 substitutes for the set of strips RE6 and RE7 of the uniform array, the set consisting of one strip REM8 substitutes for the set consisting of one strip RE10 of the uniform array, the set of strips REM9 and REM10 substitutes for the set consisting of one strip RE14 of the uniform array, the set of strips REM11 and REM12 substitutes for the set of strips RE17 and RE18 of the uniform array, and the set of strips REM13 to REM15 substitutes for the set of strips RE20 to RE22 of the uniform array. As will be explained in more detail below with respect to FIGS. 6A to 6H, the depth and length of the substituting strips is the same as that of the strips of the uniform array. However, the number, width and location along a line of propagation of acoustic waves of the at least one strip of each substituting set is such that each substituting set provides net-zero reflection of acoustic waves at a predetermined frequency, and the number and width of the at least one strip of each substituting set is furthermore such that they provide at least partial compensation for the velocity perturbation of said acoustic waves which would occur if the same net-zero reflection were provided by simple withdrawal of strips from the uniform array.

Referring now to FIG. 6A, there is shown in sectional view an arrangement of 7 strips RE31 to RE37 which are each a quarter wavelength ($\lambda/4$) wide and are located at a centre to centre spacing along a line of propagation of half a wavelength ($\lambda/2$) of acoustic waves at a predetermined frequency. They may be considered as part of either of the uniform array reflectors R1 and R2 forming the resonant cavity shown in FIG. 1, i.e. these strips are equal length, equal depth, strip shaped discontinuities at a surface of a substrate 1 centred on the same line of acoustic wave propagation at that surface. FIGS. 6B to 6H each show the group of strips RE31 to RE37 modified by substituting strips (shown shaded) which can form one or more sets of substituting strips in a weighted reflector array such as that shown in FIGS. 5D and 5E. The strip shaped discontinuities shown in sectional view in FIGS. 6A to 6H appear as layers on top of the substrate, but for the purpose of the following description of their effect as reflecting elements they may be considered as having any other suitable form, for example grooves in the substrate.

Figure 6B:
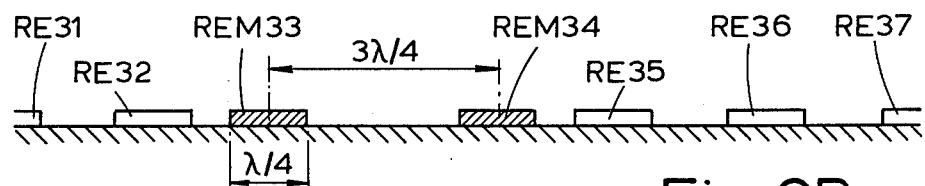
Figure 6C:
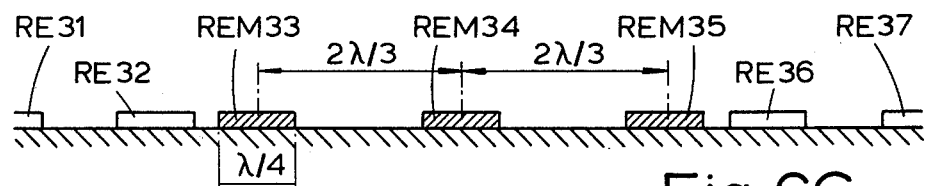
Figure 6D:
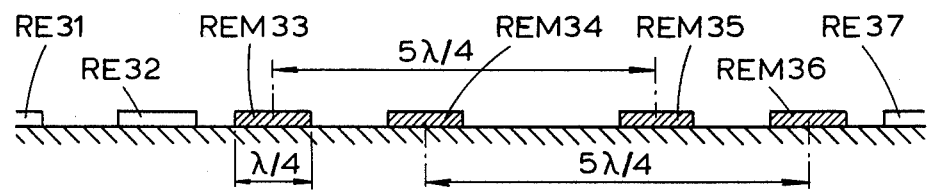
Figure 6E:
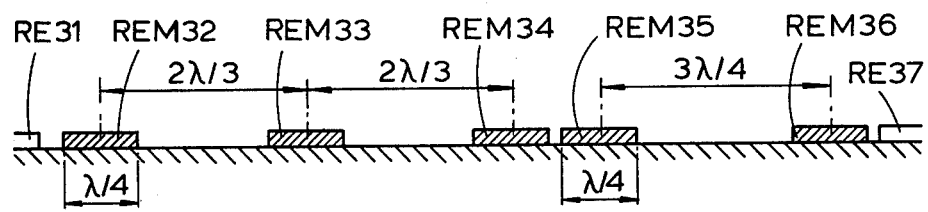

Referring now to FIGS. 6B to 6E which show examples of a substituting set of strips consisting in each case of the same number of (at least two) strips as the number of strips of a similarly positioned set of the uniform array, the width of each strip of the substituting set being a quarter wavelength ($\lambda/4$) of said acoustic waves at said predetermined frequency, and the strips of the substituting set having a centre to centre spacing along said line of propagation which differs from that of the strips of the similarly positioned set of the uniform array. In FIG. 6B, the substituting set consists of two strips REM33 and REM34 having a centre to centre spacing along said line of propagation of three quarters of a wavelength ($3\lambda/4$) of said acoustic waves at said predetermined frequency. The strips REM33 and REM34 substitute for the strips RE33 and R34 shown in FIG. 6A. Considering an incident acoustic wave from the left hand side of the drawing the strip REM33 will reflect back towards the left a certain very small proportion of the energy of that wave. The wave will then continue towards the right of the drawing and the same very small proportion of substantially the same amount of wave energy as was incident on the strip REM33 will be reflected by the strip REM34 back towards the left. The reflected wave energy from the strip REM34 will be delayed by a path length of $3\lambda/2$ with respect to the reflected wave energy from the strip REM33 thereby providing net-zero reflection from these two strips at the predetermined frequency. This explains the net-zero reflection of the two strips REM11 and REM12 shown in FIGS. 5D and 5E. In FIG. 6C, the substituting set consists of three strips REM33, REM34 and REM35 having a centre to centre spacing along said line of propagation of two thirds of a wavelength ($2\lambda/3$) of said acoustic waves at said predetermined frequency. The strips REM33, REM34 and REM35 substitute for the strips RE33, RE34 and RE35 shown in FIG. 6A. Considering an incident acoustic wave from the left hand side of the drawing the strips REM33, REM34 and REM35 will each reflect substantially the same amount of wave energy back towards the left. The reflected wave energy from the strips REM34 and REM35 will in this case be delayed by path lengths of $4\lambda/3$ and $8\lambda/3$ respectively with respect to the equal strength reflected wave energy from the strip REM33. This is equivalent to reflected wave energy of half strength from each of the strips REM34 and REM35 both in antiphase with the reflected wave energy from the strip REM33 thereby providing net-zero reflection from these three strips at the predetermined frequency. This explains the net-zero reflection of the three strips REM13, REM14 and REM15 shown in FIGS. 5D and 5E. In FIG. 6D, the substituting set consists of four strips REM33, REM34, REM35 and REM36 with a centre to centre spacing of one and a quarter wavelengths ($5\lambda/4$) of said acoustic waves at said predetermined frequency between the strips REM33 and REM35 and also between the strips REM34 and REM36. The strips REM33 to REM36 substitute for the strips RE33 to RE36 shown in FIG. 6A. The reflected wave energy from the strip REM35 will be delayed by a path length of $5\lambda/2$ with respect to the reflected wave energy from the strip REM33 thereby providing net-zero reflection from these two strips at the predetermined frequency. Similarly, the strips REM34 and REM36 will provide net zero reflection at the predetermined frequency. In FIG. 6E the substituting set consists of five strips REM32 to REM36 which substitute for the strips RE32 to RE36 shown in FIG. 6A. The three strips REM32 to REM34 have a centre to centre spacing of $2\lambda/3$ and so provide net-zero reflection at the predetermined frequency in the same manner as the set of three strips REM33 to REM35 shown in FIG. 6C. The two strips REM35 and REM36 have a centre to centre spacing of $3\lambda/4$ and so provide net-zero reflection at the predetermined frequency in the same manner as the two strips REM33 and REM34 shown in FIG. 6B. It will be noted that the spacing between the strips RE31 and REM32 in FIG. 6E is less than the spacing between the strips RE32 and REM33 shown in FIG. 6C, and also the spacing between the strips REM36 and RE37 in FIG. 6E is less than the spacing between the strips REM34 and RE35 shown in FIG. 6B. This shift of the group of three strips to the left and the group of two strips to the right is necessary in the arrangement shown in FIG. 6E to avoid overlap between the strips REM34 and REM35. As alternatives to the arrangements shown in FIGS. 6D and 6E, net-zero reflection from groups of four and five strips respectively could be provided by a suitable equal spacing of the strips within those groups. The displacement principle shown in FIGS. 6B to 6E is not limited to providing a maximum of five consecutive strips in a substituting set. For example a substituting set of six consecutive strips can be provided by three groups of two strips, each group arranged as the two strips REM33 and REM34 shown in FIG. 6B, or by two groups of three strips with each group arranged as the three strips REM33 to REM35 shown in FIG. 6C, with a suitable placement of the groups to avoid overlap in each case.

An advantage of the arrangements shown in FIGS. 6B to 6E is that, since both the number and width of the strips of the substituting set is the same as that of the strips of the similarly positioned set of the uniform array, the strips of that substituting set provide complete compensation for the velocity perturbation of acoustic waves which would occur if the same net-zero reflection were provided by simple withdrawal of strips from the uniform array. A disadvantage of the arrangements shown in FIGS. 6B to 6E is that the substituting set cannot provide net-zero reflection in place of a similarly positioned set of the uniform array consisting of only a single strip.

Figure 6F:
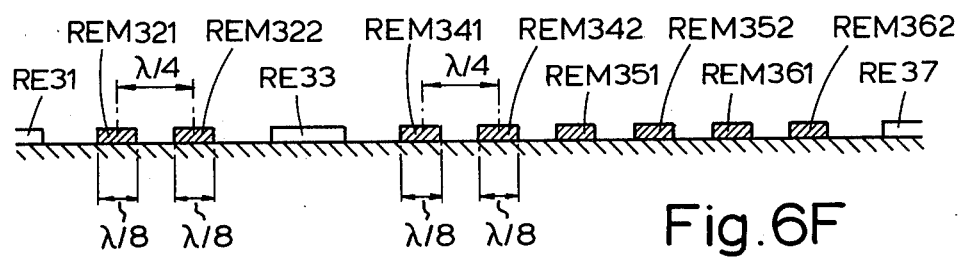

Referring now to FIG. 6F, it shows two examples of a substituting set of strips consisting in each case of at least one pair of strips, each pair of strips substituting for a corresponding one of the at least one strip of a similarly positioned set of the uniform array, and the strips of each pair having a width of an eighth of a wavelength ($\lambda/8$) and a centre to centre spacing of a quarter wavelength ($\lambda/4$) of said acoustic waves at said predetermined frequency. In the first example the substituting set consists of one pair of strips REM321 and REM322 which substitute for the strip RE32 shown in FIG. 6A. Considering an incident acoustic wave from the left hand side of the drawing the strip REM321 will reflect back towards the left a certain very small proportion of the energy of that wave. The wave will then continue towards the right of the drawing and the same very small proportion of substantially the same amount of wave energy as was incident on the strip REM321 will be reflected by the strip REM322 back towards the left. The reflected wave energy from the strip REM322 will be delayed by a path length of $\lambda/2$ with respect to the reflected wave energy from the strip REM321 thereby providing net zero reflection from these two strips at the predetermined frequency. This explains the net zero reflection of the pair of strips REM9 and REM10 shown in FIGS. 5D and 5E. The pair of strips REM341 and REM342, the pair REM351 and REM352, and the pair REM361 and REM362 substitute for the strips RE34, RE35 and RE36 respectively shown in FIG. 6A and each pair provides net zero reflection in the same manner as the pair REM321 and REM322. This explains the net zero reflection of the six strips REM1 to REM6 shown in FIGS. 5D and 5E.

An advantage of the arrangements shown in FIG. 6F is that the substituting set can provide net-zero reflection in place of a similarly positioned set of the uniform array consisting of only a single strip.

It is convenient at this point to explain the mechanisms involved in the reflections of acoustic waves produced by the discontinuities at the surface of a substrate provided by the continuous strips of the reflective arrays shown in FIGS. 1, 5 and 6. Each strip provides two edge discontinuities at the surface, that is to say a leading edge discontinuity where an acoustic wave meets the strip and a trailing edge discontinuity where an acoustic wave leaves a strip. The leading and trailing edges of a strip each reflect a portion of the acoustic wave and these two portions are of opposite phase. Thus, for example, the reflections provided by the two consecutive strips RE32 and R33 shown in FIG. 6A may be considered as adding in two different ways as follows. Firstly, the total reflection from the strip RE32 is the sum of the reflected energy from the leading left hand edge and the equal amplitude reflected energy from the trailing right hand edge which is of opposite phase at that trailing edge but is delayed by a path length of $\lambda/2$ with respect to the reflected energy from the leading edge and is therefore in phase with it. The total reflection from the strip RE33 is also the sum of the in phase components provided by its leading and trailing edges. The total reflected energy from the strip RE33 is delayed by a path length of $\lambda$ with respect to the total reflected energy from the strip RE32, and so the reflections from the two strips are in phase. Secondly, the reflections from the two leading edges of the strips RE32 and RE33 are of the same phase at those edges and add in phase due to a path length delay of $\lambda$. The reflections from the two trailing edges of the strips RE32 and RE33 are of the same phase at those edges and add in phase due to a path length delay of $\lambda$. The reflections from the two trailing edges are of opposite phase to the reflections from the two leading edges but are delayed by a path length of $\lambda/2$ with respect thereto and therefore add in phase. Thus the total reflected energy of acoustic waves propagating through a given distance along a substrate surface having a number of equal depth, equal length, strip discontinuity reflective elements of a reflective array threat depends on the number, width and relative location of those strips.

Figure 6G:
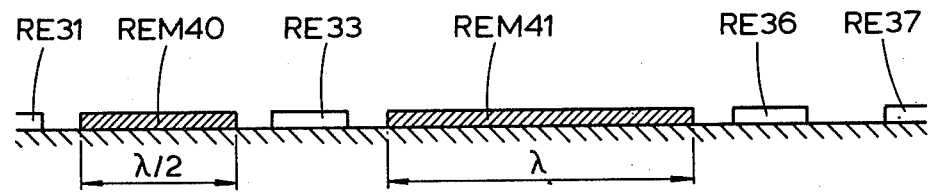
Figure 6H:
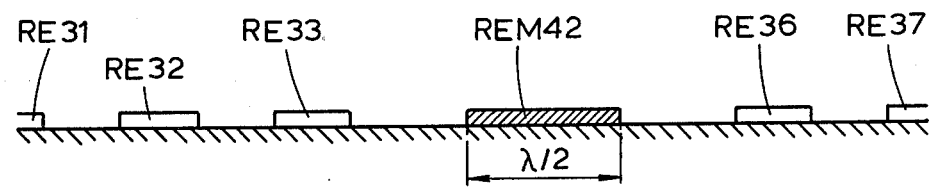

Referring now to FIGS. 6G and 6H, there are shown three examples of a substituting set consisting of a single strip, the width of the single strip being n half wavelengths, where n is an integral number including one, of said acoustic waves at said predetermined frequency. In the first example shown in FIG. 6G the single strip REM40 substitutes for the strip RE32 shown in FIG. 6A and has width of half a wavelength ($\lambda/2$) of acoustic waves at said predetermined frequency. The leading and trailing edges of the strip REM40 reflect a substantially equal amount of wave energy of opposite phase at those edges, and the reflected wave energy from the trailing edge is delayed by a path length of $\lambda$ with respect to the reflected wave energy from the leading edge thereby providing net zero reflection from the strip REM40 at the predetermined frequency. This explains the net-zero reflection of the strip REM8 shown in FIGS. 5D and 5E. In the second example shown in FIG. 6G the single strip REM41 substitutes for the set of strips RE34 and RE35 shown in FIG. 6A and has a width of one wavelength $\lambda$ of acoustic waves at said predetermined frequency. The path length delay of $2\lambda$ between the leading and trailing edges ensures net-zero reflection from the strip REM41 at the predetermined frequency, and this explains the net-zero reflection of the strip REM7 shown in FIGS. 5D and 5E. In the third example, shown in FIG. 6H, the single strip REM42 substitutes for the two strips RE34 and RE35 shown in FIG. 6A and has a width of half a wavelength ($\lambda/2$) of acoustic waves at said predetermined frequency ensuring net-zero reflection from the strip at the predetermined frequency.

An advantage of the arrangements shown in FIGS. 6G and 6H is that the substituting set can provide, when the width of the constituent single strip is one half wavelength, net-zero reflection in place of a similarly positioned set of the uniform array consisting of only a single strip.

The arrangements shown in FIGS. 6A and 6E and the arrangement of the strips REM341 to REM362 shown in FIG. 6F may be commonly described as providing a substituting set consisting of at least two strips, the sum of the widths of said at least two strips being the same as the sum of the widths of the at least one strip of the similarly positioned set of the uniform array. The arrangements shown in FIGS. 6A to 6E and the arrangement of the strip REM40 shown in FIG. 6G may be commonly described as providing a substituting set consisting of the same number of strips as the at least one strip of the similarly positioned set of the uniform array.

The mechanisms involved in the changes in velocity of acoustic waves produced by the discontinuities at the surface of a substrate provided by the continuous strips of the reflective arrays shown in FIGS. 1, 5 and 6 will now be explained. The acoustic waves undergo a delay due to storage of energy both as they meet the leading edge and as they leave the trailing edge of a strip discontinuity; and this is so whatever form the strips may take, for example grooves in the substrate or layers of conductive material on the substrate. Where the strips take the form of layers of conductive material on the substrate the velocity of acoustic waves is different (that is to say it is slowed down) as it propagates through a surface region having a strip discontinuity from that when it propagates through a surface region without such a discontinuity, and so the acoustic waves undergo an additional delay resulting from this slowing down. The time taken for an acoustic wave to propagate through a given distance along a substrate surface having a number of equal depth strip discontinuity reflective elements of a reflective array thereat thus depends on the number of those strips and possibly also on the width of those strips. If those strips are withdrawn from a uniform array, then the time taken for the acoustic wave to propagate through that distance is different and that wave may be considered as having undergone a velocity perturbation in that distance along the substrate.

Having regard to the explanation given in the previous paragraph it will now be apparent how, in a reflector array modified according to the characteristic feature of the invention, the substituting sets of strips may be formed such that together they provide at least partial compensation for the velocity perturbation of acoustic waves which would occur if the same net-zero reflection were provided by simple withdrawal of strips from the nominal uniform array. If the strips are conductive layers, then where net-zero reflection is required in the array in place of two or more strips of the uniform array the displacement arrangements shown in FIGS. 6A to 6E are preferred because they provide complete velocity perturbation compensation. Where net-zero reflection is required in the array in place of a single conductive layer strip of the uniform array, either a pair of half width strips as shown in FIG. 6F or a single double width strip as shown in FIG. 6G may be used with advantage because they provide partial velocity perturbation compensation. If the strips are grooves, then where the net-zero reflection is required in the array in place of two or more strips of the uniform array the displacement arrangements shown in FIGS. 6A to 6E will provide complete velocity perturbation compensation. Where net-zero reflection is required in the array in place of a single groove strip of the uniform array, a pair of half width strips as shown in FIG. 6F will give the same magnitude of velocity perturbation as simple withdrawal and so may not be used with advantage, whereas a single double width strip as shown in FIG. 6G may be used with advantage because it provides complete velocity perturbation compensation.

Referring now to FIG. 7, there is shown (as a solid line) the characteristic of reflectivity $|R|$ (shown on a logarithmic scale) with respect to the normalised frequency $f/f_o$ of a weighted reflector array based on a nominal uniform array consisting of 750 strips each having 0.2% reflectivity but modified according to the characteristic feature of the invention described above with respect to FIGS. 5 and 6. This reflectivity-frequency characteristic has a passband substantially similar to the main lobe of the reflectivity-frequency characteristic of the nominal uniform array and a stopband suppressed by approximately 15 to 20 db over the range of frequencies shown compared with the side lobes (shown as a dotted line) of the reflectivity-frequency characteristic of the nominal uniform array. For a typical centre frequency $f/o$ of 160 MHz the range of frequencies shown is 5 MHz. The detailed arrangement of the weighted array whose response is shown in FIG. 7 is that it is symmetrical about the centre of the array and the number of consecutive strips in a set of the nominal uniform array which is substituted by strips providing net-zero reflection increases from the centre of the array towards the ends of the array in generally the same manner as is shown in FIG. 5.

Referring now to FIG. 8, two acoustic wave resonator devices on the same substrate 1, each having two transducers in the respective cavity, are coupled together. The configuration of the pair of reflectors R11M and R21M, and of the pair of reflectors R12M and R22M, relative to the distance by which the reflectors of each pair are spaced apart is such that the combined reflective frequency passband of the reflectors of the resonators includes only three adjacent distinct resonant mode frequencies. The reflectors of each pair are modified in the manner described above for FIGS. 5 and 6 with respect to a respective nominal uniform array consisting of equal reflectivity equally spaced reflective elements. The reflectivity-frequency characteristic of each respective uniform array has a main lobe and side lobes centred on a predetermined respective frequency and the reflectivity-frequency characteristic of each modified reflector has a passband substantially similar to said respective main lobe and a stopband suppressed compared with said respective side lobes in the manner shown in FIG. 7. The nominal uniform array is the same for both reflectors of each pair and furthermore each reflector is similarly modified with respect to that nominal uniform array resulting in enhancement of the stopband suppression of the combined reflectivity-frequency response of each pair of reflectors. The input transducer ITD3 is connected to a source of electrical energy S via terminals IT3 and IT4 and the output transducer OTD21, OTD22 is connected to terminals OIT1 and OIT2. The input transducer ITD21, ITD22 is connected to the terminals OIT1 and OIT2 and the output transducer OTD2 is connected to a load Z via terminals OT3 and OT4. The configuration and arrangement of the transducers ITD3 and OTD21, OTD22, and also the configuration and arrangement of the transducers OTD3 and ITD21, ITD22 in their respective cavities are such that all these transducers have zero net coupling with standing wave energy in the cavities at the two outer mode frequencies and a non-zero net coupling with standing wave energy at the middle mode frequency of the three adjacent resonant mode frequencies included in the combined reflective frequency passband of the reflectors. Two acoustic wave resonator devices coupled together as shown in FIG. 8 by electrically connecting the output terminals of the first device to the input terminals of the second device form a coupled resonator electrical filter.

FIG. 9 shows (as a dotted line) the frequency response shown in FIG. 4 of the typical example of a transducer coupled surface acoustic wave coupled resonator electrical filter designed to have a low loss narrow passband. Also shown (as a solid line) is an estimate of the expected frequency response of that filter when it is modified in accordance with the arrangement shown in FIG. 8, that is to say with the transducers arranged to have zero coupling to the two modes at 159.7 MHz and 160.3 MHz and furthermore with the reflectors modified to suppress their sidelobe responses thereby suppressing all the "low Q" modes of the cavities which lie within those sidelobes. The response is expected to decrease smoothly from the bandwidth of 20 kHz at 3 db below the peak response to an overall stopband level of approximately 75 db below the peak response, at least over the frequency range of 2 MHz shown.

The remainder of the description of this specification is devoted to a detailed explanation of the arrangement of each of the transducers in the cavities as shown in FIG. 8 so as to have a zero net coupling with standing wave energy in the respective cavity at the two outer mode frequencies and a non-zero net coupling with standing wave energy at the middle mode frequency within the passband of the cavity reflectors. In summary, the arrangement of each transducer is that the array of electrodes is interdigitally connected in the transducer to a pair of terminals and is symmetrically arranged with respect to a central point of the cavity so as to form a plurality of pairs of electrodes with the electrodes of each pair being equally spaced in opposite directions from that central point. The central point of the cavity may coincide with a node and an antinode respectively of the standing wave at an even mode frequency which is the middle one of said three frequencies and at odd mode frequencies which are the other two of said three frequencies. In this case the two electrodes of each pair are electrically connected to different ones of said pair of terminals. The central point of the cavity may alternatively coincide with a node and an anti-node respectively of the standing wave at an odd mode frequency which is the middle one of said three frequencies and at even mode frequencies which are the other two of said three frequencies. In this case the two electrodes of each pair are electrically connected to the same one of said pair of terminals. Thus the transducer can be considered as made up of two equal halves, one in each half of the cavity. When two transducers are required to be in the cavity both transducers can have equally efficient suppression of the two outer modes with the two halves of one transducer being adjacent in a region between the two halves of the other transducer. In a device in which a single transducer is present in the cavity, each half of the transducer can occupy anything from a small portion of its half of the cavity, which may be near the centre or near the reflectors, up to the whole of its half of the cavity.

The optional feature of the invention described in the previous paragraph is described and claimed in U.S. patent application No. 947,141, but for the sake of completeness will also be described in detail below.

Referring now to FIG. 10, there is shown in plan view part of a substrate 1 able to propagate acoustic waves. A pair of spaced apart reflectors (not shown) forms a resonant cavity capable of supporting acoustic standing wave energy in the substrate 1 at a plurality of resonant mode frequencies.

The standing wave resonance pattern for each mode will exhibit nodes and antinodes in acoustic stress and strain and also nodes and antinodes in electrical potential measured at the surface. In this specification, reference to nodes and antinodes is intended to refer to minima and maxima respectively of electrical potential measured at the surface. A central point of the cavity, which is on the line I—I shown in FIG. 10, coincides with a node and an antinode respectively of the standing wave at an even mode frequency and an odd mode frequency which constitute each adjacent pair of mode frequencies supported by the cavity. The resonance patterns for three adjacent modes M1, M2 and M3 at successively decreasing frequency, i.e. increasing wavelength, are shown in FIG. 10. The modes M1 and M3 are at even mode frequencies with a node N at the centre line I—I and the mode M2 is at an odd mode frequency with an antinode AN at the centre line I—I. The positive and negative signs in FIG. 10 show the relative phase of the resonant patterns of the three modes relative to the centre line I—I at a given instant.

A transducer TD3 includes an array of electrodes Y1, X1, X2 and Y2 disposed on the surface 1 between the pair of reflectors (not shown) for coupling with acoustic standing wave energy in the cavity and interdigitally connected via bus bars BX and BY to a pair of terminals T1 and T2. The array of electrodes is symmetrically arranged with respect to the centre line I—I and forms two pairs of electrodes with the effective centres (shown by the dotted lines) of the two electrodes of each pair being equally spaced in opposite directions parallel to the length of the cavity from the centre line I—I. The pair X1 and X2 are spaced by a distance x from the line I—I and the pair Y1 and Y2 are spaced by a distance y from the line I—I. The pair X1 and X2 are electrically connected in common via the bus bar BX to the terminal T1, and the pair Y1 and Y2 are electrically connected in common via the bus bar BY to the terminal T2. For both the even modes M1 and M3, the electrodes X1 and X2 are located at opposite phases of equal magnitude of the standing wave pattern and the electrodes Y1 and Y2 are also located at opposite phases of equal magnitude of the standing wave pattern. A transducer TD3 consisting of pairs of electrodes with each pair arranged in the same manner as the pairs X1, X2 and Y1, Y2 thus has zero net coupling with standing wave energy at every even mode frequency of standing waves which the cavity is capable of supporting, irrespective of the actual values of the distances x and y. Thus if the transducer is an input transducer and an alternating potential difference is applied to the terminals T1 and T2 at the frequencies of these even modes, then these even mode standing waves will not be excited, and if the even mode standing waves exist in the cavity and the transducer is an output transducer zero output electrical signal will appear at the terminals T1 and T2 at the frequencies of these even modes. For the odd mode M2, the electrodes X1 and X2 are located at the same phase of equal magnitude of the standing wave pattern and the electrodes Y1 and Y2 are also located at the same phase of equal magnitude of the standing wave pattern. As shown in FIG. 10 x is an integral number of half wavelengths at the frequency of the mode M2 and y is one half wavelength greater than x at that frequency, and so the transducer has a maximum coupling with standing wave energy at the frequency of the mode M2. Thus if the transducer is an input transducer and an alternating potential difference is applied to the terminals T1 and T2 at the frequency of the mode M2, that odd mode standing wave will be exited with the maximum efficiency, and if the odd mode M2 standing wave exists in the cavity and the transducer is an output transducer an electrical signal will appear at the terminals T1 and T2 at the frequency of that mode M2 and with maximum amplitude. For the transducer TD3 to be useful the actual values of the distances x and y must be arranged to ensure that the transducer has a non-zero net coupling with standing wave energy at at least one odd mode frequency which the cavity is capable of supporting. For example, if the distances x and y were such that all the electrodes were located on nodes of a particular odd mode or were such that all the electrodes were located on antinodes of the same phase of a particular odd mode, and in either such case if that odd mode were the only one which the cavity was capable of supporting, then the transducer would not be useful.

Referring now to FIG. 11, the substrate 1 is the same as that shown in FIG. 10 and the reflectors forming a resonant cavity are again not shown. The resonance patterns for three adjacent modes M4, M5 and M6 are shown, the modes M4 and M6 being at odd mode frequencies with an antinode AN at the centre line I—I of the cavity and the mode M5 being at an even mode frequency with a node N at the centre line I—I.

A transducer TD4 includes an array of electrodes X3, Y3, X4 and Y4 disposed on the surface 1 between the pair of reflectors for coupling to acoustic standing wave energy in the cavity and interdigitally connected via the bus bars BX and BY to a pair of terminals T3 and T4. Each of the electrodes is split into two electrode parts displaced from the effective centre of that electrode (shown by the dotted lines) by equal distances in opposite directions parallel to the length of the cavity. The array of electrodes is symmetrically arranged with respect to the centre line I—I and forms two pairs of electrodes with the effective centres of the two electrodes of each pair being equally spaced in opposite directions parallel to the length of the cavity from the centre line I—I. The pair Y3 and X4 are spaced by a distance x from the line I—I and the pair X3 and Y4 are spaced by a distance y from the line I—I. The pair Y3 and X4 are electrically connected to different ones of the terminals T4 and T3 respectively by the bus bars BY and BX, and the pair X3 and Y4 are electrically connected to different ones of the terminals T3 and T4 respectively by the bus bars BX and BY. For both the odd modes M4 and M6, the electrodes Y3 and X4 are located at the same phases of equal magnitude of the standing wave pattern and the electrodes X3 and Y4 are also located at the same phases of equal magnitude of the standing wave pattern. A transducer TD4 consisting of pairs of electrodes with each pair arranged in the same manner as the pairs Y3, X4 and X3, Y4 thus has zero net coupling with standing wave energy at every odd mode frequency of standing waves which the cavity is capable of supporting, irrespective of the actual values of the distances x and y. For the even mode M5, the electrodes Y3 and X4 are located at opposite phases of equal magnitude of the standing wave pattern and the electrodes X3 and Y4 are also located at opposite phases of equal magnitude of the standing wave pattern. As shown in FIG. 11 x is an integral number of half wavelengths at the frequency of the mode M5 and y is one half wavelength greater than x at that frequency, and so the transducer has a maximum coupling with standing wave energy at the frequency of the mode M5. For the transducer TD4 to be useful the actual values of the distances x and y must be arranged to ensure that the transducer has a non-zero net coupling with standing wave energy at at least one even mode frequency which the cavity is capable of supporting.

Referring now to FIG. 12, the substrate 1 is the same as that shown in FIGS. 10 and 11 and the reflectors forming a resonant cavity are again not shown. Two transducers OTD3 and ITD21, ITD22 are provided, exemplifying on an enlarged scale the similarly referenced transducers shown in FIG. 7, and each is arranged for odd mode suppression in the same manner as the transducer TD4 of FIG. 11. An output transducer OTD3 has two adjacent halves, each half comprising four electrodes, on either side of the centre line I—I of the cavity formed by the reflectors. The array of electrodes of transducer OTD3 is interdigitally connected via bus bars OBX and OBY to a pair of output terminals OT3 and OT4. The array of electrodes of transducer OTD3 is symmetrically arranged with respect to the centre line I—I and forms four pairs of electrodes with the effective centres of the two electrodes of each pair being equally spaced in opposite directions parallel to the length of the cavity from the centre line I—I. For example, the outer pair of electrodes are referenced OX3 and OY4 and shown spaced by a distance y from the line I—I and the adjacent pair of electrodes are referenced OY3 and OX4 and shown spaced by a distance x from the line I—I. An input transducer has two halves ITD21 and ITD22, each half comprising four electrodes, on either side of the centre line I—I and separated by the output transducer OTD3. The array of electrodes of the transducer ITD21, ITD22 is interdigitally connected via bus bars IBX1, IBX2, IBY1 and IBY2 to a pair of input terminals OIT2 and OIT1. The array of electrodes of transducer ITD21, ITD22 is symmetrically arranged with respect to the centre line I—I and forms four pairs of electrodes with the effective centres of the two electrodes of each pair being equally spaced from the center line I—I and in opposite directions parallel to the length of the cavity. For example, the outer pair of electrodes are referenced IX3 and IY4 and shown spaced by a distance q from the line I—I and the adjacent pair of electrodes are referenced IY3 and IX4 and shown spaced by a distance p from the line I—I. For both the output transducer OTD3 and the input transducer ITD21, ITD22 the two electrodes of each pair, as described above, are electrically connected to different ones of the respective pair of output or input terminals whereby both the output transducer and the input transducer have a zero net coupling with standing wave energy at each odd mode frequency at which the cavity is capable of supporting an acoustic standing wave, and the spacing of the electrodes of each respective array from the central line I—I of the cavity, i.e. the actual values of the distances x, y, p and q, is furthermore arranged to ensure that both the output transducer OTD3 and the input transducer ITD21, ITD22 have a non-zero net coupling with standing wave energy at at least one even mode frequency at which the cavity is capable of supporting an acoustic standing wave.

In FIG. 12, the transducer electrodes may be single electrodes as shown for the transducer TD3 in FIG. 10 or split electrodes as shown for the transducer TD4 in FIG. 11.

We claim:

1. An acoustic wave resonator device comprising, a substrate able to propagate acoustic waves, a pair of spaced apart reflectors forming a resonant cavity capable of supporting acoustic standing wave energy in the substrate, each said reflector comprising an array of parallel reflective elements disposed one behind another at a surface of said substrate, at least one of the reflectors being modified with respect to a nominal uniform array of equal reflectivity equally spaced reflective elements, the reflectivity-frequency characteristic of the uniform array having a main lobe and side lobes centred on a predetermined frequency and the reflectivity-frequency characteristic of said at least one modified reflector having a passband substantially similar to said main lobe and a stopband suppressed compared with said side lobes, and a transducer including an array of electrodes disposed at said substrate surface for coupling with acoustic standing wave energy in the cavity, characterized in that each of the reflective elements of said nominal uniform array comprise a discontinuity formed as a strip at said substrate surface, said strips each being a quarter wavelength wide and having the same depth and length and being centred on the same line of acoustic wave propagation at said substrate surface and being located at a centre to centre spacing along said line of propagation of half a wavelength of said acoustic waves at said predetermined frequency, and that said one reflector is modified with respect to the uniform array to include a plurality of sets of at least one consecutive strip which substitute for an equal number of similarly positioned sets of at least one consecutive strip of the uniform array, the depth and length of the substituting strips being the same as that of the strips of the uniform array and the number, width and location along said line of propagation of the at least one strip of each substituting set being such that each substituting set provides net-zero reflection of said acoustic waves at said predetermined frequency.

2. A resonator device as claimed in claim 1 wherein at least one substituting set includes at least two strips, and wherein the sum of the widths of said at least two strips is the same as the sum of the widths of the at least one strip of the similarly positioned set of the uniform array.

3. A resonator device as claimed in claim 1 wherein at least one substituting set includes the same number of strips as the at least one strip of the similarly positioned set of the uniform array.

4. A resonator device as claimed in claim 1 wherein at least one substituting set includes the same number of at least two strips as the number of strips of the similarly positioned set of the uniform array, wherein the width of each strip of that substituting set is a quarter wavelength of said acoustic waves at said predetermined frequency, and wherein the strips of said substituting set have a centre to centre spacing along said line of propagation which differs from that of the strips of the similarly positioned set of the uniform array.

5. A resonator device as claimed in claim 4 wherein said substituting set comprises two strips having a centre to centre spacing along said line of propagation of three quarters of a wavelength of said acoustic waves at said predetermined frequency.

6. A resonator device as claimed in claim 4 wherein said substituting set comprises three strips having a centre to centre spacing along said line of propagation of two thirds of a wavelength of said acoustic waves at said predetermined frequency.

7. A resonator device as claimed in claim 1, wherein at least one substituting set includes at least one pair of strips, in which each pair of strips substitutes for a corresponding one of the at least one strip of the similarly positioned set of the uniform array, and wherein the strips of each pair have a width of an eighth of a wavelength and a centre to centre spacing of a quarter wavelength of said acoustic waves at said predetermined frequency.

8. A resonator device as claimed in claim 1 wherein at least one substituting set comprises a single strip, and in which the width of the single strip is n half wavelengths, where n is an integral number including one, of said acoustic waves at said predetermined frequency.

9. A resonator device as claimed in any one of claims 1 to 8 wherein each of the reflective elements of the reflectors comprise a layer of conductive material on the surface of said substrate.

10. A resonator device as claimed in claim 9 wherein the reflective elements of the reflectors and the electrodes of the transducer are formed of the same conductive material.

11. A resonator device as claimed in claim 9 wherein the reflective elements of each reflector are connected by at least one bus bar of conductive material disposed on the surface of said substrate.

12. A resonator device as claimed in any one of claims 1 to 8 wherein each of the pair of reflectors is modified with respect to a respective nominal uniform array comprising equal reflectivity equally spaced reflective elements, the reflectivity frequency characteristic of each respective uniform array having a main lobe and side lobes centred on a predetermined respective frequency and the reflectivity-frequency characteristic of each modified reflector having a passband substantially similar to said respective main lobe and a stopband suppressed compared with said respective side lobes.

13. A resonator device as claimed in claim 12 wherein each of the pair of reflectors is similarly modified with respect to the same nominal uniform array.

14. A resonator device as claimed in any one of claims 1 to 8 wherein the configuration of the reflectors relative to the distance by which they are spaced apart is arranged so that the combined reflectivity-frequency passband of the pair of reflectors includes only three adjacent distinct resonant mode frequencies, a central point of the cavity coinciding with a node and an antinode respectively of the standing wave at an even mode frequency which is the middle one of said three frequencies and at odd mode frequencies which are the other two of said three frequencies, wherein the array of electrodes of the transducer is located within the cavity and is interdigitally connected to a pair of terminals, in which the array of electrodes is symmetrically arranged with respect to said central point of the cavity and forms a plurality of pairs of electrodes with the effective centres of the two electrodes of each pair being equally spaced in opposite directions parallel to the length of the cavity from said central point of the cavity, wherein the two electrodes of each pair are electrically connected to different ones of said pair of terminals whereby the transducer has a zero net coupling with standing wave energy at both odd mode frequencies, and wherein the spacing of the electrodes from the central point of the cavity is chosen to ensure that the transducer has a non-zero net coupling with standing wave energy at said even mode frequency.

15. A resonator device as claimed in any one of claims 1 to 8 wherein the configuration of the reflectors relative to the distance by which they are spaced apart is arranged so that the combined reflectivity-frequency passband of the pair of reflectors includes only three adjacent distinct resonant mode frequencies, a central point of the cavity coinciding with a node and an antinode respectively of the standing wave at an odd mode frequency which is the middle one of said three frequencies and at even mode frequencies which are the other two of said three frequencies, wherein the array of electrodes of the transducer is located within the cavity and is interdigitally connected to a pair of terminals, in which the array of electrodes is symmetrically arranged with respect to said central point of the cavity and forms a plurality of pairs of electrodes with the effective centres of the two electrodes of each pair being equally spaced in opposite directions parallel to the length of the cavity from said central point of the cavity, wherein the two electrodes of each pair are electrically connected to the same one of said pair of terminals whereby the transducer has a zero net coupling with standing wave energy at both even mode frequencies, and wherein the spacing of the electrodes from the central point of the cavity is further arranged to ensure that the transducer has a non-zero net coupling with standing wave energy at said odd mode frequency.

16. An electrical filter including two acoustic wave resonator devices as claimed in any one of claims 1 to 8 wherein said transducer in one of the devices forms input transducing means arranged to launch acoustic wave energy into the cavity of that device which forms acoustic standing wave energy therein, and means for coupling the cavities of the two devices whereby acoustic standing wave energy is formed in the cavity of the other device, and wherein said transducer in the other device forms output transducing means arranged to receive acoustic wave energy from the cavity of the other device.

* * * * *